United States Patent [19]

Tsang

[11] Patent Number: 4,636,268
[45] Date of Patent: Jan. 13, 1987

[54] CHEMICAL BEAM DEPOSITION METHOD UTILIZING ALKYL COMPOUNDS IN A CARRIER GAS

[75] Inventor: Won-Tien Tsang, New Providence, N.J.

[73] Assignee: AT&T Bell Laboratories, Murray Hill, N.J.

[21] Appl. No.: 676,658

[22] Filed: Nov. 30, 1984

[51] Int. Cl.$^4$ .................. H01L 21/203; H01L 21/205
[52] U.S. Cl. .................................. 148/175; 29/576 E; 148/DIG. 110; 148/DIG. 169; 156/611; 156/612; 156/613; 156/DIG. 70; 156/DIG. 103

[58] Field of Search ... 29/576 E; 148/175, DIG. 110, 148/DIG. 169; 156/611-613, DIG. 70, DIG. 103

[56] References Cited

U.S. PATENT DOCUMENTS

| | | | |
|---|---|---|---|
| 4,063,974 | 12/1977 | Fraas | 156/611 X |
| 4,147,573 | 4/1979 | Morimoto | 156/DIG. 103 |
| 4,239,584 | 12/1980 | Chang et al. | 148/175 X |
| 4,330,360 | 5/1982 | Kubiak | 156/610 |
| 4,392,453 | 7/1983 | Luscher | 148/175 X |
| 4,477,311 | 10/1984 | Mimura et al. | 148/175 X |

FOREIGN PATENT DOCUMENTS 58-116  1/1983  Japan ........................ 156/DIG. 103

OTHER PUBLICATIONS

*Journal of Crystal Growth* 55, 1981, "Metalorganic CVD of GaAs in a Molecular Beam System," E. Veuhoff, W. Pletschen, P. Balk, and H. Luth, pp. 30-34.

*Journal of Applied Physics* 51 (11), 1981, "A New Low Temperature III-V Multilayer Growth Technique: Vacuum Metalorganic Chemical Vapor Deposition", L. M. Fraas, pp. 6939-6943.

Morris et al., "New GaAs . . . Vacuum Deposition Technique . . . Phosphine Gas", J. Vac. Sci. Technol., vol. 11, No. 2, Mar./Apr. 1974, pp. 506-510.

Calawa, A. R., "On the Use of $AsH_3$ in Molecular Beam Epitaxial Growth of GaAs" Appl. Phys. Lett., 38 (9), May 1, 1981, pp. 701-703.

Calawa, A. R., "Effect of $H_2$ on Residual Impurities in GaAs MBE Layers" Appl. Phys. Lett., 33(12), Dec. 15, 1978, pp. 1020-1022.

Primary Examiner—William G. Saba
Attorney, Agent, or Firm—Peter A. Businger

[57] ABSTRACT

Epitaxial layers of semiconductor materials such as, e.g., III-V and II-VI materials are deposited on a substrate under high-vacuum conditions. Molecules of a compound of a constituent of such material travel essentially line-of-sight towards the substrate admixed to a carrier gas such as, e.g., hydrogen. For III-V layers the use of compounds, such as, e.g., trimethyl- and triethyl-gallium, trimethyl- and triethylindium, triethylphosphine, and trimethylarsine is advantageous and economical in the manufacture of electronic and opto-electronic devices.

11 Claims, 2 Drawing Figures

CHEMICAL BEAM DEPOSITION METHOD UTILIZING ALKYL COMPOUNDS IN A CARRIER GAS

FIELD OF THE INVENTION

The invention is concerned with the deposition of semiconductor layers.

BACKGROUND OF THE INVENTION

Epitaxially deposited layers of semiconductor materials play a key role in high-speed device technology, III-V materials such as, e.g., gallium arsenide, gallium phosphide, indium gallium arsenide, indium gallium arsenide phosphide, and gallium arsenide phosphide being of particular current interest in devices such as, e.g., high-speed electronic and optoelectronic devices. Among classes of methods proposed for the deposition of such layers on suitable substrates are methods known as liquid phase epitaxy (LPE) and vapor phase epitaxy (VPE), the latter being considered particularly suitable for the deposition of high-quality layers especially when used under conditions of extreme vacuum as in a method known as molecular beam epitaxy (MBE).

While the quality of MBE-deposited layers is exemplary, alternate deposition methods have been proposed as motivated largely by a desire to reduce processing costs. In this respect, the use of so-called metalorganic gases as starting materials has been studied as reported, e.g., by L. M. Fraas, "A New Low-Temperature III-V Multilayer Growth Technique: Vacuum Metalorganic Chemical Vapor Deposition", *Journal of Applied Physics*, Vol. 52 (1981), pp. 6939-6943, and by E. Veuhoff et al., "Metalorganic CVD of GaAs in a Molecular Beam System", *Journal of Crystal Growth*, Vol. 55 (1981), pp. 30-34.

SUMMARY OF THE INVENTION

In the interest of facilitating the industrial production of semiconductor epitaxial layers such as, in particular, Group IV, III-V, II-VI and IV-VI layers, deposition involves the use of a carrier gas under high-vacuum conditions. Starting materials are compounds such as, e.g., organo-metallic compounds like temethyl- or triethylgallium, trimethyl- or triethylindium, dimethyl- or diethylcadmium, and dimethyl- or diethyltellurium, triethylphosphine, or trimethylarsine; considered particularly suitable among inorganic compounds are silane, hydrogen sulphide, phosphine, and arsine.

DETAILED DESCRIPTION

Figure 1:
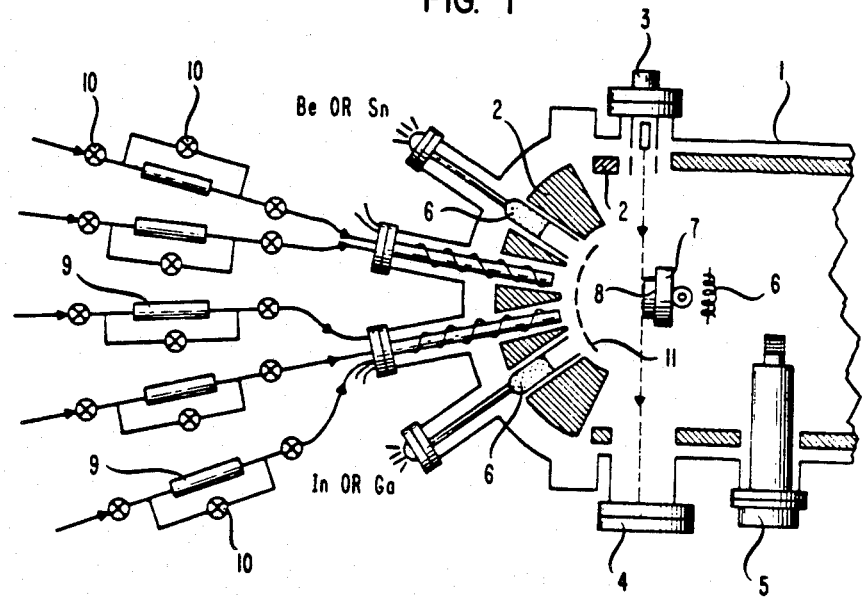
FIG. 1 schematically shows an epitaxial deposition system as may be used to practice the invention.

FIG. 1 shows vacuum chamber 1, cooling shrouds 2, reflection high energy electron diffraction (RHEED) gun 3 and screen 4, residual gas analyzer 5, evaporation furnaces 6, substrate holder 7, substrate 8, precision electronic mass flow meters 9, valves 10, and shutters 11.

During deposition, chamber pressure preferably is less than $10^{-2}$ torr and typically about $5 \times 10^{-4}$ torr as maintained by a magnetically suspended turbo-molecular pump and a helium cryogenic pump. In general, pressure is sufficiently low for essentially line-of-sight travel of molecules towards the substrate, i.e., the mean free path (distance travelled by a molecule between collisions with another molecule) is greater than the distance between an inlet point and the substrate.

Indium and gallium are typically produced directly at the heated substrate by pyrolysis of the metalorganic compound, and arsenic and phosphorus by thermal decomposition of a compound as it passes through a tantalum- or molybdenum-buffered heated aluminum tube. Group III alkyls are preferably mixed with a carrier gas such as, e.g., hydrogen, nitrogen, neon, helium, or argon; hydrogen and nitrogen are preferred in that their use enhances the quality of the deposited layer in addition to facilitating metered control. Preferred is a carrier gas flow resulting in the arrival of at least $10^{13}$ atoms/cm$^2$ per second at the substrate; more typically, such arrival rate is at least $10^{15}$ atoms/cm$^2$ per second.

In spite of the use of a carrier gas, reagents travel essentially line-of-sight towards the substrate, thus allowing for the effective use of mechanical shutters, e.g., for reducing transient flow effect during valving. In this fashion abrupt compositional changes and the deposition of ultra-thin layers are achievable.

In addition to metalorganic gas sources, effusion cells containing charges of condensed phase elements such as, e.g., Group III, Group V, and dopants can be used.

Current strong interest in III-V materials notwithstanding the method is further applicable to the deposition of silicon, germanium, II-VI materials such as, e.g., mercury cadmium telluride, and IV-VI materials such as, e.g., lead tin telluride.

Figure 2:
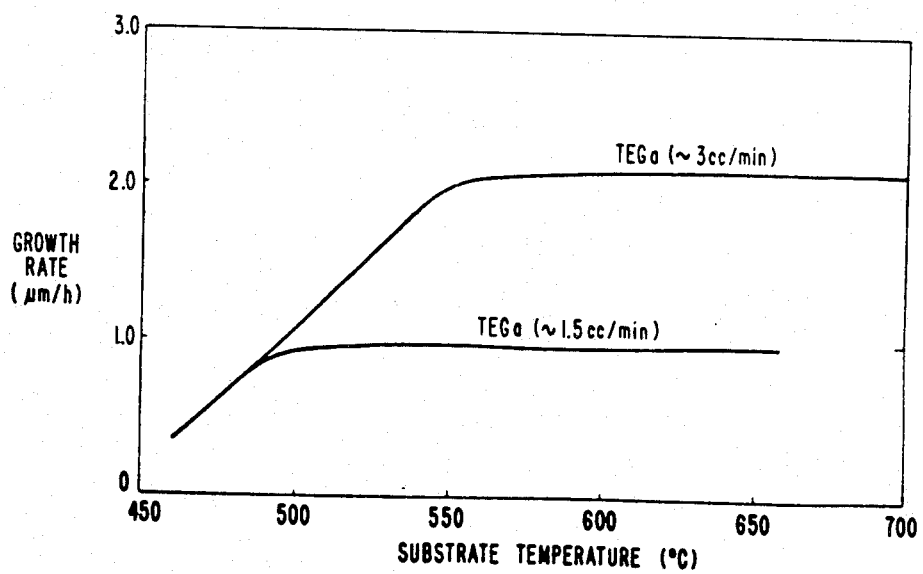
FIG. 2 diagrammatically shows growth rate as a function of substrate temperature during growth of gallium arsenide at different flow rates of triethylgallium.

Growth kinetics in this system can be appreciated by Reference to FIG. 2 which shows growth rates of gallium arsenide as a function of substrate temperature of triethylgallium (TEGa) for two different flow rates. It is apparent from FIG. 2 that growth rate increases with substrate temperature only up to a point, after which such rate remains constant. Such functional relationship may be interpreted in terms of growth rate ultimately being limited by the arrival rate of the Group III alkyl molecules at the substrate surface, in accordance with line-of-sight arrival of molecules in the absence of a stagnant boundary layer.

EXAMPLE

A layer having the nominal composition In$_{0.53}$Ga$_{0.47}$As was grown on an InP substrate. Trimethylindium and triethylgallium were used as the Group III sources, and trimethylarsine as the As source. Substrate diameter was 3.8 centimeters. Palladium-diffused hydrogen was used as the carrier gas for transporting trimethylindium and triethylgallium; the carrier gas was admixed by bubbling through liquid trimethylindium and triethylgallium while the respective containers were held at temperatures of 37 degrees C. and 35 degrees C. The total pressures of hydrogen and trimethylindium and of hydrogen and triethylgallium were controlled and held constant by means of a pressure-sensing and feedback valve control. The flow rates of these gas mixtures were controlled by separate precision electronic mass flow controllers. Trimethylarsine was mixed with hydrogen gas at a ratio of 1 to 13 before feeding into the cracker furnace. Separate inlets were used for Group III and Group V alkyls. Growth temperature was held constant at approximately 500 degrees C., and a growth rate of approximately 3 micrometers per hour was observed; deposited layer thickness was approximately 2 micrometers. X-ray diffraction was used to verify structural perfection and compositional uniformity of the layer as manifested by narrow linewidth. Double-crystal X-ray diffraction was used to measure lattice mismatch, and relative mismatch less than 0.001 was reproducibly obtained. The surface of the layer was examined by means of a Nomarski phase contrast microscope; a featureless, mirror-like surface was observed across the entire wafer. The optical quality of the layer was evaluated by means of room-temperature photoluminescence measurement; excitation was at 2.5 watts per square centimeter from an argon laser at a wavelength of 4880 Angstroms.

The electrical quality of the layer was studied by Hall mobility measurement at room temperature by means of the standard van der Pauw technique. Electron concentration was found to be approximately $7 \times 10^{15}$ per cubic centimeter, and electron mobility at 300 degrees K. was approximately 9000 cm$^2$/V per second.

What is claimed is:

1. Method for making a device, said method comprising epitaxially depositing a layer of a semiconductor material on a substrate, said method comprising a step of exposing said substrate to a beam comprising at least one species of molecules of an alkyl compound comprising a constituent of said material, said substrate being heated in a high-vacuum environment, and said molecules being admitted to the vicinity of said substrate in a carrier gas.

2. Method of claim 1 in which said carrier gas consists essentially of one or several gases selected from the group consisting of hydrogen, nitrogen, neon, helium, and argon.

3. Method of claim 1 in which said carrier gas arrives at said substrate at a rate which is greater than or equal to $10^{13}$ atoms/cm$^2$.

4. Method of claim 1 in which said high-vacuum environment provides for a mean free path of said molecules which is greater than the distance between a common point of origin of said molecules and said substrate.

5. Method of claim 4 in which said high vacuum environment is less than $10^{-2}$ torr.

6. Method of claim 4, said method further comprising a step of placing a mechanical shutter in the path between said common point of origin and said substrate.

7. Method of claim 1 in which said species is an organo-metallic compound.

8. Method of claim 1 in which said material is a III-V material.

9. Method of claim 1 in which said material is a II-VI material.

10. Method of claim 1 in which said material is a IV-VI material.

11. Method of claim 1 in which said material is a Group IV material.

* * * * *